US011261538B1

(12) United States Patent
Moradian et al.

(10) Patent No.: US 11,261,538 B1
(45) Date of Patent: Mar. 1, 2022

(54) IN-SITU TEMPERATURE MAPPING FOR EPI CHAMBER

(71) Applicant: Applied Materials, Inc., Santa Clara, CA (US)

(72) Inventors: Ala Moradian, Sunnyvale, CA (US); Zuoming Zhu, Sunnyvale, CA (US); Patricia M. Liu, Saratoga, CA (US); Shu-Kwan Lau, Sunnyvale, CA (US); Flora Fong-Song Chang, Saratoga, CA (US); Enle Choo, Saratoga, CA (US); Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/027,385

(22) Filed: Sep. 21, 2020

(51) Int. Cl.
*C30B 25/16* (2006.01)
*H01L 21/67* (2006.01)
*C30B 25/10* (2006.01)

(52) U.S. Cl.
CPC .............. *C30B 25/16* (2013.01); *C30B 25/10* (2013.01); *H01L 21/67248* (2013.01)

(58) Field of Classification Search
CPC ........ G01J 5/0007; G01J 5/047; G01K 13/00; H01L 21/67115; H01L 21/67248; H01L 22/12; H01L 22/26
See application file for complete search history.

(56) References Cited

U.S. PATENT DOCUMENTS

| | | | |
|---|---|---|---|
| 5,258,824 A | 11/1993 | Carlson et al. | |
| 6,204,483 B1 * | 3/2001 | Fair | F27D 19/00 |
| | | | 219/388 |
| 10,409,306 B2 | 9/2019 | Ranish | |
| 2011/0185969 A1 * | 8/2011 | Yang | H01L 21/67115 |
| | | | 118/666 |
| 2013/0130187 A1 * | 5/2013 | Moroi | H01L 21/68764 |
| | | | 432/32 |
| 2014/0147798 A1 * | 5/2014 | Burkhardt | H01L 21/67115 |
| | | | 432/1 |
| 2017/0125308 A1 * | 5/2017 | Hung | H01L 21/3247 |
| 2018/0254208 A1 | 9/2018 | Chang et al. | |
| 2019/0127851 A1 | 5/2019 | Lau et al. | |

FOREIGN PATENT DOCUMENTS

WO 2019226252 A1 11/2019

OTHER PUBLICATIONS

International Search Report and Written Opinion for PCT/US2021/046270 dated Dec. 6, 2021.

* cited by examiner

*Primary Examiner* — Jaehwan Oh
(74) *Attorney, Agent, or Firm* — Patterson + Sheridan, LLP

(57) ABSTRACT

The present invention provides methods and apparatus for processing semiconductor substrates in an epitaxy chamber configured to map a temperature profile for both substrates and interior chamber components. In one embodiment, the semiconductor processing chamber has a body having ceiling and a lower portion defining an interior volume. A substrate support is disposed in the interior volume. A mounting plate is coupled to the ceiling outside the interior volume. A movement assembly is coupled to the mounting plate. A sensor is coupled to the movement assembly and moveable relative to the ceiling. The sensor is configured to detect a temperature location in the interior volume.

19 Claims, 5 Drawing Sheets

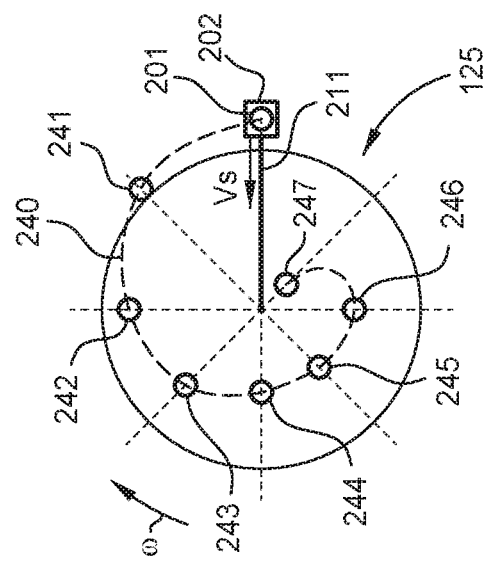
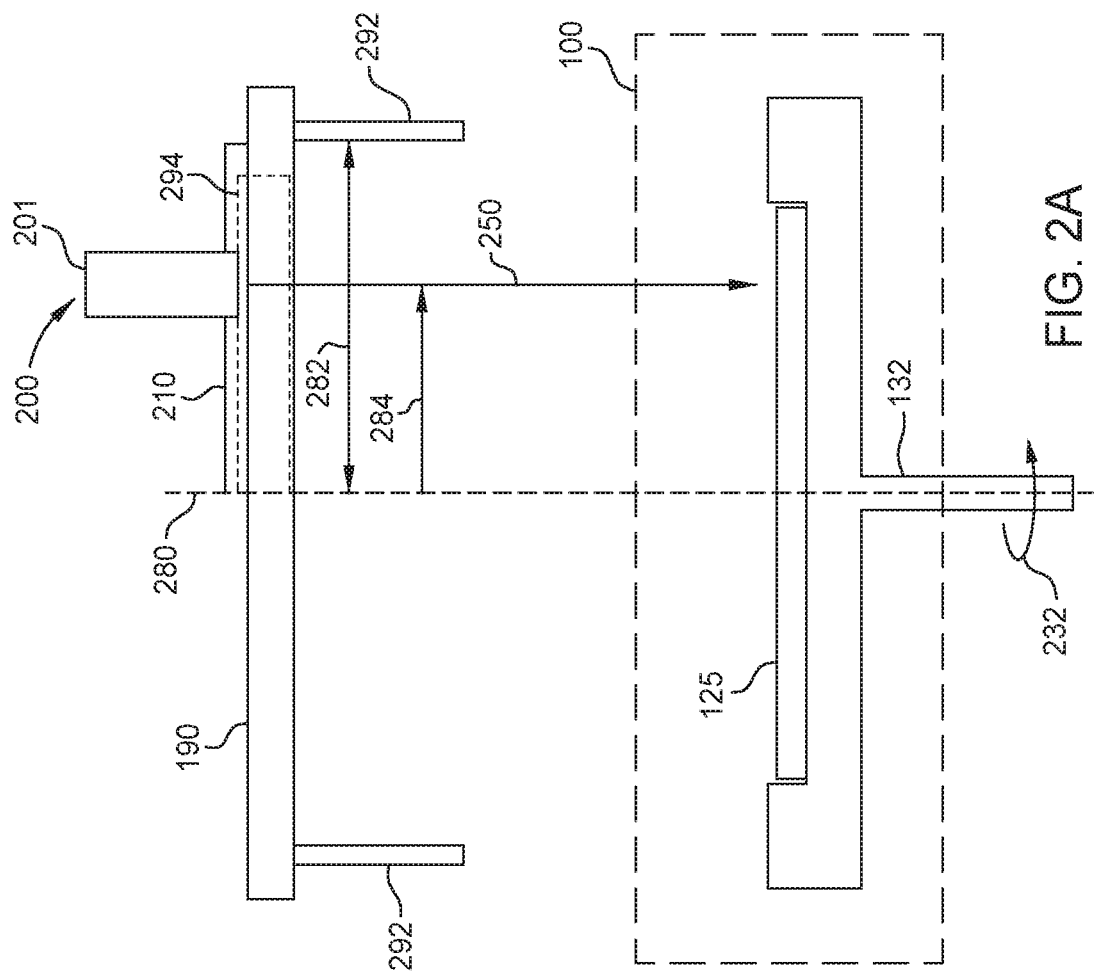
FIG. 2B
FIG. 2A

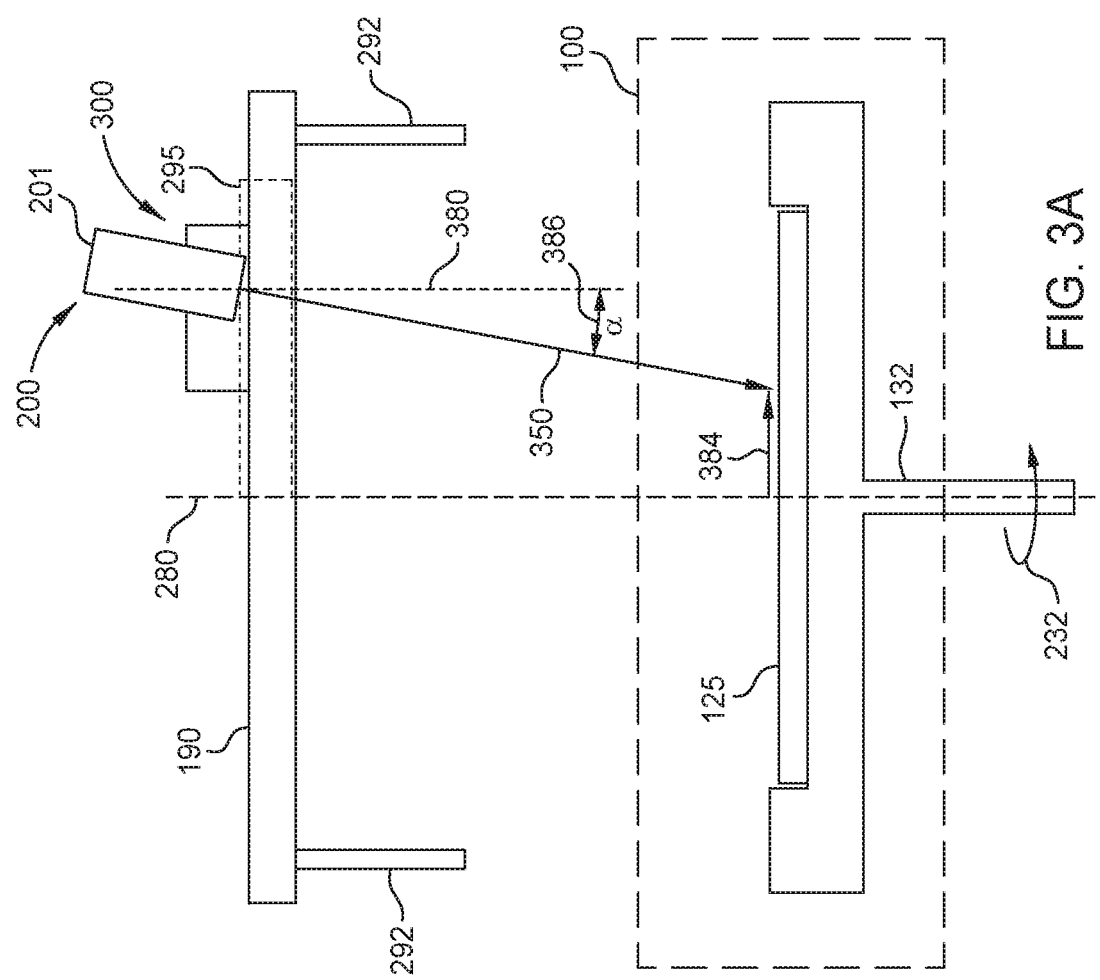

IN-SITU TEMPERATURE MAPPING FOR EPI CHAMBER

BACKGROUND

Field

The present disclosure relates to apparatus and method for mapping temperatures in a processing chamber. More particularly, the present invention relates to apparatus and method in-situ temperature mapping of substrates in an epitaxy processing chamber.

Description of the Related Art

Semiconductor substrates are processed for a wide variety of applications, including the fabrication of integrated devices and micro devices. Varieties of semiconductor processing systems and/or chambers are utilized to perform a variety of operations/methods in the formation of the devices on the semiconductor substrates. One method of processing substrates includes etching material on an upper surface of a substrate. Another method of processing substrates includes depositing a material, such as a semiconductor material or a conductive material, on the upper surface of the substrate.

Epitaxy is one example of a deposition process that deposits films of various materials on a surface of a substrate in a processing chamber. Epitaxy processes are able to produce such high-quality films on substrates under certain process conditions, such as temperature, pressures, and precursor flow rates, within the processing chambers. Any variations in process parameters such as temperature, pressure and precursor flows result in film thickness and profile's variation. During the deposition process, non-uniform gas flow, heat flow/transmission, or dopant gas concentration across the substrate surface may undesirably result in the resultant silicon epitaxial layer having different film properties at different locations. For example, sheet resistance as measured at an edge of the silicon epitaxial layer may be different from that measured at the center, as heat or process precursor gas may not be distributed uniformly across the substrate surface. In some cases, fluctuation of sheet resistance at different locations of the substrate surface may be significant, which may undesirably create device performance reliability issues, and even damage product yield.

To monitor various process conditions, sensors are used to determine the temperature of specific chamber components with each sensor measuring a specific location and thus a single component. Thus, multiple sensors are required to measure more than a single chamber component in addition to the substrate during processing. All of the sensor combine to provide feedback for properly processing the substrate.

Therefore, there is a need for apparatus and methods to monitor and control temperature of the substrate to ensure uniformity and identify potential issues related to wafer heating mechanism or wafer placement before the deposition step starts.

SUMMARY

The present invention provides methods and apparatus for processing semiconductor substrates in an epitaxy chamber configured to map a temperature profile for both substrates and interior chamber components. In one embodiment, the semiconductor processing chamber has a body having ceiling and a lower portion defining an interior volume. A substrate support is disposed in the interior volume. A mounting plate is coupled to the ceiling outside the interior volume. A movement assembly is coupled to the mounting plate. A sensor is coupled to the movement assembly and moveable relative to the ceiling. The sensor is configured to detect a temperature location in the interior volume.

In another embodiment, a sensor assembly for an epitaxy processing chamber is disclosed. The sensor assembly has a sensor coupled to movement assembly mounted outside of the epitaxy processing chamber. The sensor is configured to detect a temperature at a location disposed within an interior volume of the epitaxy processing chamber, wherein movement assembly is operable to direct the sensor to the location within the interior volume for temperature sensing.

In yet another embodiment, a method for mapping the temperature of a substrate in a processing chamber is disclosed. The method begins by placing a substrate on a substrate support assembly within a processing chamber, wherein the processing chamber has a ceiling disposed above the substrate support. The temperature of the substrate is detected with a sensor disposed above the ceiling of the processing chamber. The sensor is moveable relative to the ceiling to traverse the substrate with a plurality of temperature readings. A temperature map of the substrate is generated with the plurality of temperature readings.

BRIEF DESCRIPTION OF THE DRAWINGS

So that the manner in which the above recited features of the present invention can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the invention may admit to other equally effective embodiments.

FIG. 2A is a side view schematically illustrating a mounting plate with one embodiment of an articulating sensor assembly for the epitaxy process chamber of FIG. 1.

FIG. 2B is a top view schematically illustrating the view path of the sensor along the top surface of a substrate disposed in the epitaxy process chamber of FIG. 1.

FIG. 3A is a side view schematically illustrating the mounting plate with another embodiment of the articulating sensor assembly for the epitaxy process chamber of FIG. 1.

To facilitate understanding, identical reference numerals have been used, where possible, to designate identical elements that are common to the figures. It is contemplated that elements and features of one embodiment may be beneficially incorporated in other embodiments without further recitation.

Figure 1:
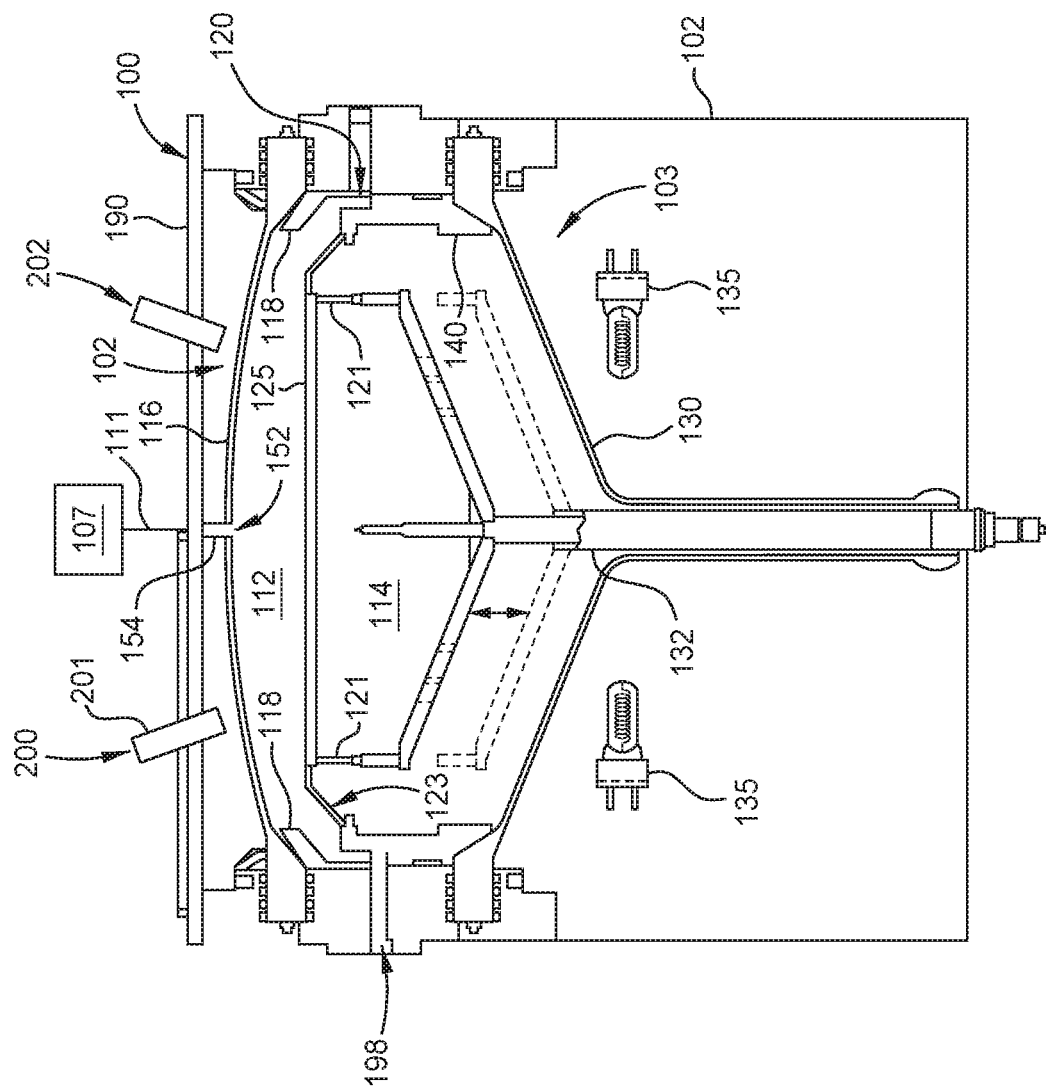
FIG. 1 schematically illustrates a sectional view of one embodiment of an epitaxy process chamber.

It is to be noted, however, that the appended drawings illustrate only exemplary embodiments of this invention and are therefore not to be considered limiting of its scope, for the invention may admit to other equally effective embodiments.

DETAILED DESCRIPTION

For film deposition, e.g., in an epitaxy chamber, a substrate support assembly is often used to support the substrate as well as heat the substrate during processing. The substrate is heated by absorbing radiation from lamps positioned outside of the epitaxy chamber. The substrate support assembly and substrate are rotated to minimize temperature non-uniformities resulting from the direct radiation of the lamps. Ideally, the rotation makes the temperature profile axisymmetric. As discussed below, an articulating sensor is disclosed to provide real-time operational feedback for process parameters of the processing chamber. For example, a sensor measures the temperature of a substrate across a number of locations to assist in maintaining optimum processing conditions as well as identify potential issues, which may result in an asymmetric thermal profile on the substrate if not corrected. For example, the temperature sensor can detect temperature disparities on the substrate that are indicative of the substrate being out of the pocket (i.e., not properly seated and centered on the substrate support assembly). Additionally, the temperature sensor can be utilized to confirm the integrity of the process temperature across the whole substrate surface and other components of the epitaxy chamber.

At least two methods for measuring the temperature profile across the substrate are enabled through the use of an articulating sensor. In one example, a radial scanning pyrometer is utilized as the sensor. The pyrometer analyzes a wavelength at which Si is opaque and quartz is transparent (e.g., 2.4 um) and moves on a linear, arcing or rotating stage. The wafer pyrometer can be directed (e.g., articulated) to scan along the radius extending from the chamber body and ending at the center of the substrate. The scanned IR signal obtained by the wafer pyrometer, correlated with the rotational speed of the substrate support assembly, is logged as a function of radius. The radial scanning pyrometer may additionally be used for tuning chamber parameters to enable the real time thermal uniformity monitoring/control, or run to run control using a mapping feedback of measured temperature locations versus desired temperatures for the same locations in the processing chamber. The apparatus is also suitable for establishing a reference for chamber setup and chamber to chamber matching. In some embodiments, one or multiple sensors, e.g. thermometers or thermal cameras, can be mounted on a linear or curved motion controlled stage spanning across a top of the processing chamber. The sensor is suitable to monitor temperatures at the very edge of the chamber and the substrate which is not practical with current large spot pyrometers.

Signals collected from the sensor are logged as a function of polar coordinates on the process plane. The process plane can include preheat ring, substrate support assembly edge, as well as the substrate or even a chamber liner. Depending on the resolution required (e.g. n=49 sampling points (e.g., locations)) and the rotational speed of the substrate support assembly ($\omega$), the speed of the stage (Vs) may be adjusted to collect the required number of data points in scanning the radius of the process plane in "m" complete rotations of substrate. The measurement can be repeated, if needed or desired, and an average of the data can be processed. If an equal distance temperature profile of the substrate in radial direction is desired, a variable speed on the linear (or curved) stage may be used. Alternatively, a variable rotational speed of the substrate support assembly can provide similar outcome for determining the equal distance temperature profile of substrate.

The mapping of the temperature of the substrate can be axisymmetric mapping in the two dimensional (2D) plane or in three dimensions (3D).

The sensor is mounted to a stage. In one example, the sensor is fixed mounted to the stage. In another example, the sensor is gimbal and/or rotationally mounted to a stage. The stage may offer additional movement to the sensor. For example, the sensor is mounted to a stage having a linear travel. In another example, the sensor is mounted to a stage rotated to target different spots across the process plane. In a yet another example, a combination of linear and rotational motion of the stage mounted sensor may be implemented to enhance the reach of the detection inside the chamber.

FIG. 1 schematically illustrates a sectional view of one embodiment of an epitaxy process chamber 100 in accordance with embodiments of the present invention. In one embodiment, an epitaxy processing chamber 100 that may be adapted to benefit from the invention is an EPI CENTURA® near atmospheric chemical vapor deposition (CVD) System, available from Applied Materials, Inc., of Santa Clara, Calif. The epitaxy processing chamber 100 presented herein shown in schematic is one embodiment and is not intended to be limiting of all possible embodiments. It is envisioned that other substrate processing chambers can be used in accordance with embodiments described herein, including chambers from other manufacturers.

The epitaxy chamber 100 comprises a chamber body 101, support system 104, and a chamber controller 106. The chamber body 101 includes the upper reflector module 102 and the lower lamp module 103. The upper reflector module 102 includes the area within the chamber body 101 between a ceiling 116 and a substrate support assembly 132 disposed within the chamber body 101. The ceiling 116 may be formed from a transparent quartz or other suitable material. In one example, the ceiling 116 may be an upper dome. The epitaxy chamber 100 additionally has an articulating sensor assembly 200. The articulating sensor assembly 200 is coupled to the epitaxy chamber 100. In one example, the articulating sensor assembly 200 is to a mounting plate 190 that is attached to the ceiling 116. The mounting plate 190 may additionally be a reflector. The mounting plate 190 reflects back the energy to the substrate and may have openings only where the articulating sensor assembly 200 needs to have line of sight to the process volume. Alternately, articulating sensor assembly 200 may be attached directly to the ceiling 116.

The lower lamp module 103 includes the area within the chamber body 101 between a lower portion 130 of the chamber body 101 and the substrate support assembly 132. In one example, the lower portion 130 may be a lower dome. Deposition processes generally occur on an upper surface of a substrate 125 supported on the substrate support assembly 132 and exposed to the upper reflector module 102. The substrate 125 is supported by support pins 121 disposed beneath the substrate 125 and extending from the substrate support assembly 132.

An upper liner 118 is disposed within the upper reflector module 102 and is adapted to prevent undesired deposition onto chamber components. The upper liner 118 is positioned adjacent to a ring 123 within the upper reflector module 102. The ring 123 (explain what is does).

The epitaxy chamber 100 includes a plurality of heat sources, such as lamps 135, which are adapted to provide thermal energy to components positioned within the epitaxy chamber 100. For example, the lamps 135 may be adapted to provide thermal energy to the substrate 125 and the ring 123. The lower portion 130 may be formed from an optically transparent material, such as quartz, to facilitate the passage of thermal radiation therethrough.

The chamber body 101 also includes an outer inlet port 198 formed through a sidewall of the chamber body 101 and a central inlet port 152 formed on a center region of the upper dome where a center gas line 154 is coupled to. An outer gas line (not shown) and an inner gas line 111 may be coupled to the outer inlet port 198 and the central inlet port 152 respectively to deliver gases supplied from a gas panel module 107. An exhaust port 127 may be coupled to the chamber body 101 to maintain the epitaxy chamber 100 at a desired regulated pressure range as needed. The outer inlet port 198 may be adapted to provide a gas, including doping gas, reacting gas, non-reacting gas, inert gas, or any suitable gas therethrough into the upper reflector module 102 of the chamber body 101. Thermal decomposition of the gas onto the substrate 125 configured to form an epitaxial layer on the substrate 125 is facilitated by the lamps 135.

The substrate support assembly 132 is positioned in the lower lamp module 103 of the chamber body 101. The substrate support assembly 132 is illustrated supporting a substrate 125 in a processing position. The substrate support assembly 132 includes a plurality of support pins 121 and a plurality of lift pins 133. The lift pins 133 are vertically moveable and are adapted to contact the underside of the substrate 125 to lift the substrate 125 from a processing position (as shown) to a substrate transfer position. The components of the substrate support assembly 132 can be fabricated from quartz, silicon carbide, graphite coated with silicon carbide or other suitable materials.

The ring 123 is removably disposed on a lower liner 140 that is coupled to the chamber body 101. The ring 123 is disposed around the internal volume of the chamber body 101 and circumscribes the substrate 125 while the substrate 125 is in the processing position. The ring 123 can be formed from a thermally-stable material such as silicon carbide, quartz or graphite coated with silicon carbide. The ring 123, in combination with the position of the substrate 125, separates the volume of the upper reflector module 102 from the lower lamp module 103. The ring 123 directs gas flow through the upper reflector module 102 when the substrate 125 is positioned level with the ring 123. The separate volume of the upper reflector module 102 enhances deposition uniformity by controlling the flow of process gas as the process gas is provided to the epitaxy chamber 100.

The support system 104 includes components used to execute and monitor pre-determined processes, such as the growth of epitaxial films in the epitaxy chamber 100. The support system 104 includes one or more of the gas panel modules 107, gas distribution conduits, power supplies, and process control instruments. A chamber controller 106 is coupled to the support system 104 and is adapted to control the epitaxy chamber 100 and support system 104. The chamber controller 106 includes a central processing unit (CPU), a memory, and support circuits. Instructions resident in chamber controller 106 may be executed to control the operation of the epitaxy chamber 100. The epitaxy chamber 100 is adapted to perform one or more film formation or deposition processes therein. For example, a silicon epitaxial growth process may be performed within the epitaxy chamber 100. It is contemplated that other processes may be performed within the epitaxy chamber 100.

During film deposition in the epitaxy chamber 100, the substrate 125 is heated. The substrate 125 is heated by absorbing radiation from the lamps 135. The substrate support assembly 132 and substrate 125 are rotated to minimize temperature non-uniformities resulted from the direct radiation of the lamps 135.

The articulating sensor assembly 200 provides real-time operational feedback for process parameters in the epitaxy chamber 100 utilizing temperature sensing. The articulating sensor assembly 200 has one or more sensors 201, 202 configured to provide temperature information which can be moved into an orientation that enables detecting temperature at a selected location within the epitaxy chamber 100. For example, articulating sensor assembly 200 is operable to move the one or more sensors 201, 202 into an orientation that enables temperature to be sensed for one or more of the upper liner 118, the ring 123, the lower portion 130, the ceiling 116, the substrate 125, the substrate support assembly 132 or other internal chamber component. In one example, the sensor 201 measures the temperature of the substrate 125 to assist in maintaining optimum processing conditions as well as identify potential issues, which may result in an asymmetric thermal profile on the substrate 125. For example, the sensor 201 can detect when the substrate 125 is not properly positioned on substrate support assembly 132 and confirm the integrity of the process temperature across the whole surface of the substrate 125. The articulating sensor assembly 200 may be configured to move the sensor 201 in a linear fashion and/or rotate the sensor 201.

FIG. 2A is a side view schematically illustrating the mounting plate 190 with one embodiment of the articulating sensor assembly 200 suitable for use in the epitaxy process chamber 100 of FIG. 1. A reflector 292 is attached to the mounting plate 190 and shown figuratively to encompass the bounded area of the upper reflector module 102. In some example, the mounting plate 190 is a reflector and reflector 292 is part of the mounting plate 190. Similarly, the substrate support assembly 132 is illustrated as a solid body when the substrate support assembly 132 may be either solid as shown in FIG. 2A or hollow as shown in FIG. 1. The operation of the articulating sensor assembly 200 is not limited by the configuration of the epitaxy process chamber 100, or other processing chambers.

The articulating sensor assembly 200 includes a stage 290 to which the sensor 201 is attached. The stage 290 is disposed on a linear rail 210. The linear rail 210 may be a track, or other suitable mechanism for ensuring linear movement of the stage 290 attached to the linear rail 210. A movement assembly 260 may control the stage location along the linear rail 210. The movement assembly 260 may be a linear motor, a servo motor, stepper motor, pneumatic cylinder, hydraulic cylinder, or other type of actuator suitable for creating movement of the stage 290 along the linear rail 210. In this manner, movement of the stage 290 can be precisely limited to the length and direction of the linear rail 210. Thus, the sensor 201 disposed in stage 290 moves relative to the mounting plate 190 and the ceiling 116. The linear rail 210 may have a length 284 sufficient to move the stage 290 from a center 280 of the epitaxy process chamber 100 to the reflector 292.

Figure 4:
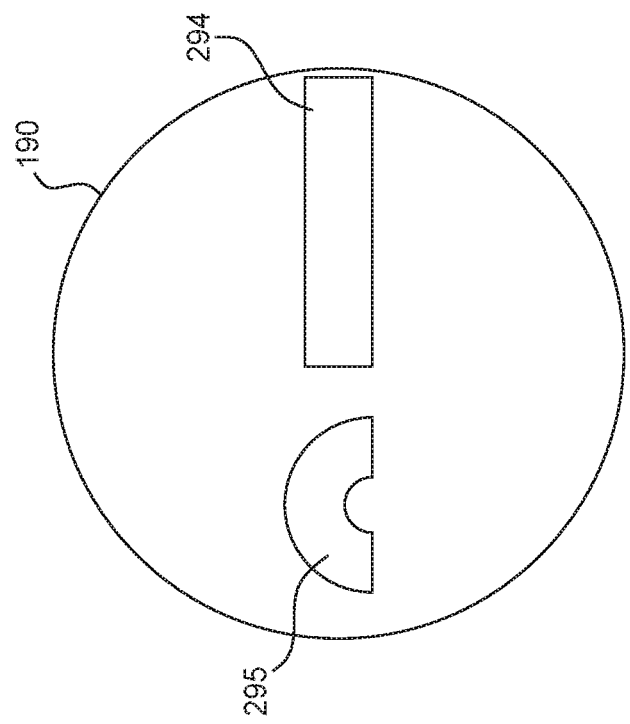
FIG. 4 is a top view schematically illustrating a window in a mounting plate on top of the ceiling of the epitaxy process chamber of FIG. 1.

A window 294 is formed in the mounting plate 190 and/or the reflector above the ceiling 116. Turning briefly to FIG. 4, FIG. 4 is a top view schematically illustrating the window 294 in the mounting plate 190 of the epitaxy process chamber 100. The sensor 201 is configured to move with the stage 290 and while maintaining alignment with the window 294 such that the sensor 201 may detect temperatures within the epitaxy process chamber 100 while moving along with the state 290. The window 294 may be formed from quartz or other material transparent to the sensing signal of the sensor 201.

The sensor 201 is configured to detect a temperature at a selected location in the interior volume of the epitaxy process chamber 100. The sensor 201 may be a pyrometer, camera, or other suitable device for measuring temperature. In one example, the sensor 201 is a camera operating at a wavelength of between about 8 um to about 14 um. In one example, the sensor 201 is a pyrometer operating at a wavelength such as 2.4 um where the quartz material in the window 294 is transparent, i.e., less than about 4 um. The wavelength of the sensor 201 may be modified or changed to measure temperature of the ceiling 116 below the window 294. The sensor 201 may be fixed to the stage 290 such that the orientation of the sensor 201 relative to the mounting plate 190 is unchanged as the sensor 201 moves along the linear rail 210. The sensor 201 emits a sensing beam 250 that is directed through the window 294 into the epitaxy process chamber 100. The sensing beam 250 may be moved from the center 282 the outer limits, i.e., reflector 292, of the epitaxy process chamber 100 for measuring parameters of the epitaxy process chamber 100 or the substrate 125 disposed within the epitaxy process chamber 100.

FIG. 2B is a top view schematically illustrating a view path 240 of the sensor 201 along a top surface 225 of the substrate 125 disposed in the epitaxy process chamber 100. The view path 240 is created by the sensing beam 250 emitted by the sensor 201 traversing over the top surface 225 of the substrate 125. The substrate 125 is rotated at an angular velocity (ω) by a rotation 232 of the substrate support assembly 132. The combination of the rotation 232 of the substrate support assembly 132 and a linear velocity 211 of the sensor 201 along the linear rail 210 may be adjusted in forming a variety of different view path 240. For example, the sensor 201 may extend along first radius 284 project the beam 250 on a first sample location 241. The combination of rotation 232 and linear velocity 211 and a sample interval connect together in forming the view path 240. For example the first sample location 241, a second sample location 242, ⅓ sample location 243, fourth sample location 244, a fifth sample location 245, a sixth sample location 246, and a seventh sample location 247 all combine in the formation of view path 240. It should be appreciated that if an equal distance in a radial direction is needed the linear velocity 211 may be set to zero, i.e., no movement, while the rotation 232 is performed. In the manner described above an asymmetric mapping or actual 3D map can be generated which illustrate the temperature of the substrate 125.

It should also be appreciated, that the beam 250 can be focused on the substrate support assembly 132 while the substrate 125 is not present to determine the temperature of the substrate support assembly 132. Likewise, the beam 250 can be focused past the substrate support assembly in determining a temperature of the lower dome 114 or other chamber component. Additionally can be shown, by sampling at an equal distance in a radial direction along the outer perimeter of the substrate 125, that it can be determined if the substrate 125 is outside the pocket of the substrate support assembly 132. For example, the temperature profile of the substrate 125 along the outer edge may show a cold or hot arc where the substrate support assembly 132 is actually being sampled by the beam 250 instead of the expected substrate 125.

FIG. 3A is a side view schematically illustrating the mounting plate 190 with another embodiment of the articulating sensor assembly 200 that may be utilized in the epitaxy process chamber 100 of FIG. 1. The epitaxy process chamber 100 is substantially similar to that discussed above with respect to FIG. 1 and FIG. 2A. The articulating sensor assembly 200 has the sensor 201 attached to a stage 300.

Figure 3B:
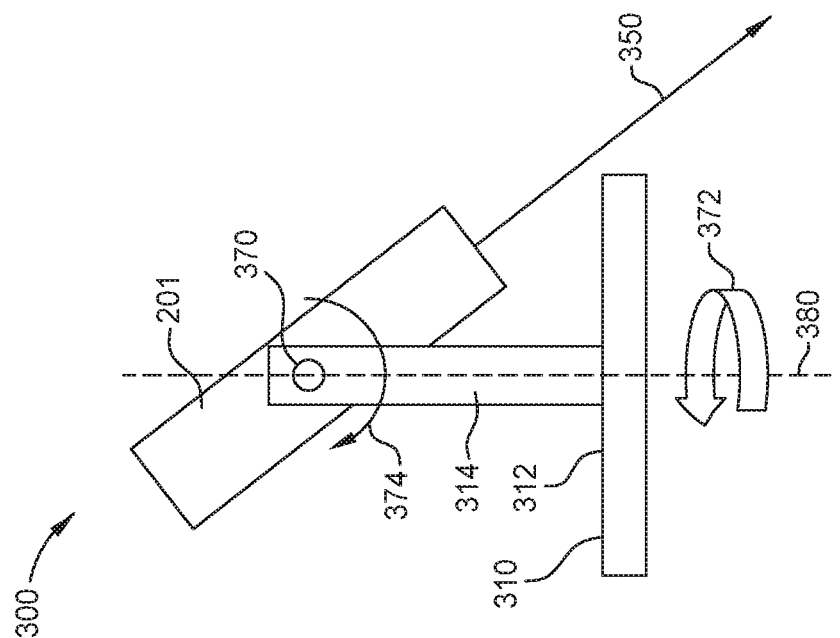
FIG. 3B is a side view schematically illustrating a rotational bracket for the sensor of FIG. 3A.

FIG. 3B is a side view schematically illustrating the stage 300 coupled to the sensor 201. The stage 300 may be fixed, i.e., non-moveable, or have a rotational bracket 310. The stage 300 has a base 312 and an upright support 314. The sensor 201 may be fixed or movably attached to the upright support 314. For example, the sensor 201 may be attached to the to the upright support 314 by a pivot 370 extending through the upright support 314. The pivot 370 may be fixedly attached to the sensor 201 such that rotation of the pivot 370 will rotate the sensor 201, which in turn orientates the sensor 201 to enable temperature information to be obtained from different locations within the epitaxy process chamber 100. Alternately, the pivot 370 may freely extend through the sensor 201 such that the sensor 201 may be rotated about the pivot 370 and independent of rotation of the pivot 370. For example, the pivot 370 may be a smooth rod which fits through an oversized whole in the sensor 201 such as the sensor 201 may move independently of the smooth rod.

The sensor 201 may be moved about one or more axis of rotation. For example the sensor 201 may rotate (as shown by arrow 372) along a centerline 380 orthogonal to the mounting plate 190. Additionally, or alternately, the sensor 201 may rotate (as shown by arrow 374) along the pivot 370 extending parallel to the mounting plate 190. One or more movement assembly 260 may provide the rotation, as depicted by arrow 372 and/or arrow 374, for directing a beam 350 of the sensor 201 to different selected locations within the epitaxy process chamber 100.

In one example, the sensor 201 rotates about the pivot 370 and the stage 300 is stationary. The rotation of the sensor 201 about the pivot 370 is controlled by the movement assembly 260. The movement assembly 260 may be a cylinder, motor or other actuator suitable for moving either the pivot 370 and sensor 201 together, or or moving the sensor 201 about the pivot 370. The base 312 may have a slot or other feature which prevents interruption of the beam 350 as the beam 350 is directed into the epitaxy process chamber 100. In another example, the base 312 may be formed from a quartz material transparent to beam 350. Thus, as the sensor 201 rotates about the pivot 370, the beam 350 is controllably directed form the center 280 to the reflectors 292. As the substrate support assembly 132 rotates the substrate 125, the beam 350 pivoting through an angle 386 traverses a length 384 linearly along the substrate 125 such that temperature information across the entire substrate 125 may be obtained utilizing a single sensor 201. This configuration allows for a beam path similar to what is shown and described in FIG. 2B.

In another example, the sensor 201 is fixed about the pivot 370 and the stage 300 is rotatable by way of the rotational bracket 310. Turning briefly again to FIG. 4, FIG. 4 schematically illustrates a window 295 in the mounting plate 190 of the epitaxy process chamber 100 of FIG. 1. The window 295 is curved to match the rotation of the sensor 201 on the rotational bracket 310. The movement assembly 260 may be part of the rotational bracket 310, or alternatively mounted to the mounting plate 190 or the stage 300 to rotate the rotational bracket 310. The rotational bracket 310 may move through about 180° to about 360° of rotation. The rotational movement of the sensor 201 coupled with the rotation of the substrate support assembly 125 results in orienting the beam across a path that scans the entire surface of the substrate 125 for mapping the temperature of the substrate. Rotation of the sensor 201 at the extremes, i.e., near 180° and 0°, may move the sensor beam 350 off the substrate 125 for measuring temperatures of chamber components such as the lower portion 130 of the epitaxy chamber 100, among others.

In yet another example, the sensor 201 may rotate about the pivot 370 while also being rotated by the rotational bracket 310. These two axes of rotation allows for the beam 350 to be directed in a manner that increases the locations in which temperature may be sensed by the sensor 201. Thus, processing conditions in the epitaxy chamber environment can be more closely monitored and maintained. Through controlling of the movement of the beam 350 along with the movement of the substrate support assembly 132, a comprehensive mapping for the temperature along the top of the substrate 125 and substrate support assembly 132 can be obtained. The comprehensive mapping enables more precise control over the epitaxial process.

In yet another example the sensor 201 may rotate about the pivot 370, rotate by the rotational bracket 310, and linearly travel along the linear rail 210. Such an arrangement allows for the sensor 201 to reach and detect temperatures of nearly all surfaces in the interior volume of the epitaxy chamber 100, such as the upper liner 118, the ring 123, the lower portion 130, the ceiling 116, the substrate 125, the substrate support assembly 132 or other internal chamber component.

Figure 5:
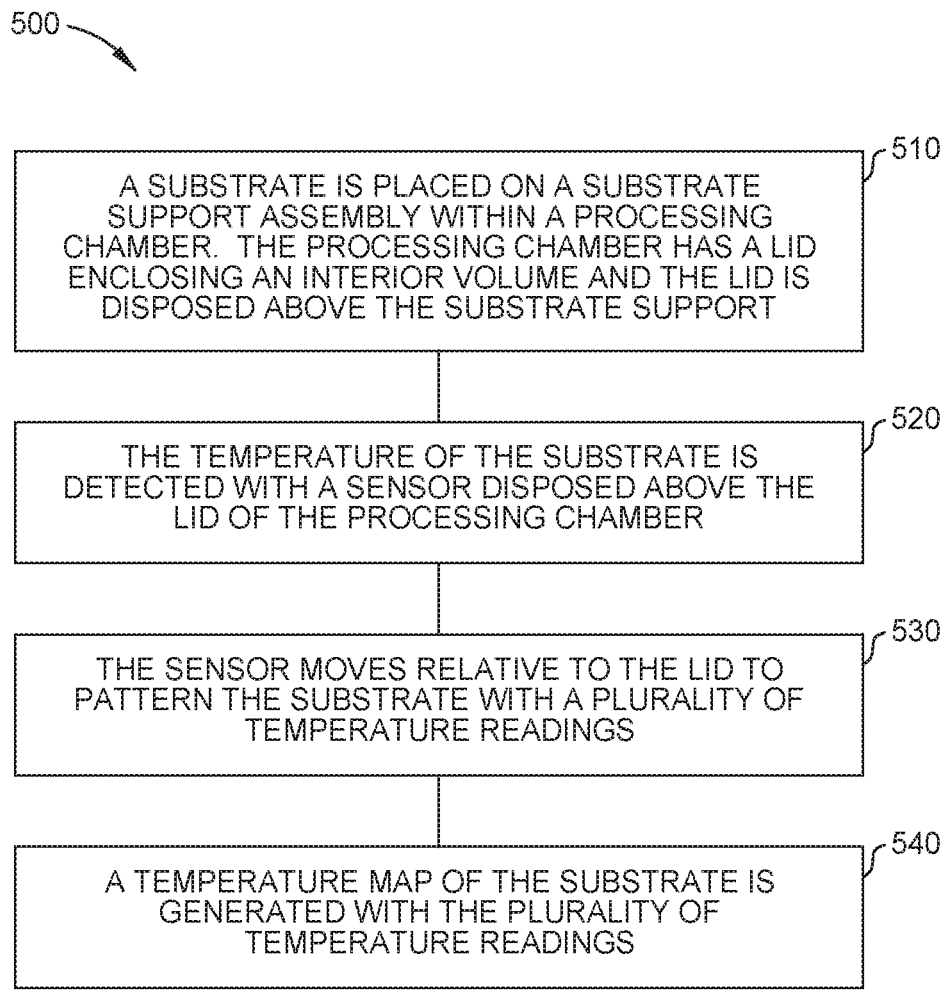
FIG. 5 is a method for mapping temperature of a substrate in a processing chamber.

FIG. 5 is a flow diagram for a method 500 for mapping the temperature of a substrate in a processing chamber. The method 500 begins at operation 510 by placing a substrate on a substrate support assembly within an epitaxy process chamber. The epitaxy process chamber has an upper dome enclosing an interior volume and the upper dome is disposed above the substrate support assembly. In one example, the epitaxy process chamber is as described with respect to the Figures above.

At operation 520, the temperature of the substrate is detected using an articulating sensor disposed above the upper dome of the processing chamber. In one example, the sensor is a pyrometer. In another example, the sensor is a camera.

At operation 530, the sensor is moved relative to the upper dome to obtain a plurality of temperature readings across the surface of the substrate. The sensor may linearly move along a linear rail coupled to the lid. Alternately, or additionally, the sensor is coupled to a rotating and/or linearly movable stage supporting the sensor and the stage is coupled to the lid. In other alternatives, or additions to prior examples, the sensor may be pivoted on a stage supporting the sensor.

At operation 540, a temperature map of the substrate is generated utilizing the plurality of temperature readings. The temperature map be of a substrate disposed in the epitaxy processing chamber. The temperature map may additionally or alternatively be of chamber components which may be utilized for monitoring the health of the epitaxy processing chamber. The temperature map may be indicative of process skew. The temperature map may additionally provide an indication of a fault condition such as the substrate being miss positioned on the substrate support assembly. The temperature map may include calculated and/or measured temperature locations. In one example, a computer having a processor and memory may run a software routine that takes as input the measured temperatures locations and interpolate between the locations to provide calculated temperatures in formation of the temperature map. The temperature map may be compared to acceptable ranges of temperatures for one or more location on the temperature map. A message may be sent in response to a determination that the temperature map has sampled or calculated temperature at one or more locations that are outside of acceptable ranges.

The 3D map constructed by the disclosed invention can further be used in conjunction with a supervised or unsupervised machine learning algorithm where some of the fault scenarios are automatically identified and notification issued to the user. For example, a set of cases where the substrate is out of susceptor pocket can be mapped and the set can be used to train the algorithm. In another example, anomalous temperature of other parts in the chamber, such as susceptor, preheat-ring, upper or lower dome may also be identified by an artificial intelligence and machine learning algorithm which is trained by intentionally engineered faults such as issues with lamps, dome coating, cracks, or susceptor coating degradation. Each of these training sets can be used to augment the algorithm to intelligently identify the issue and either notify the user immediately or depending on the severity of the issue automatically schedule for relevant inspection and/or maintenance procedure during next planned maintenance.

Advantageously, in the examples described above, the sensor 201 is movable relative to the ceiling 116 and able to precisely monitor processing conditions such as temperature skew as well as potential error conditions such as substrates 125 not properly situated on the substrate support assembly 132. Thus, a single sensor can replace a multitude of sensors while providing a greater benefit and understanding of processing conditions for reducing defects on the substrates.

While the foregoing is directed to embodiments of the present invention, other and further embodiments of the invention may be devised without departing from the basic scope thereof, and the scope thereof is determined by the claims that follow.

What is claimed is:

1. A semiconductor processing chamber comprising:
   a body having an ceiling and lower portion defining an interior volume;
   a substrate support disposed in the interior volume;
   a movement assembly above the ceiling outside the interior volume; and
   a sensor coupled to the movement assembly and rotatable relative to the ceiling, the sensor configured to detect a temperature location in the interior volume.

2. The semiconductor processing chamber of claim 1, wherein the sensor is configured to detect through a window in the ceiling a temperature of the lower portion of the body and the substrate support.

3. The semiconductor processing chamber of claim 2, wherein the movement assembly further comprises:
   a mounting plate, the mounting plate coupling the movement assembly to the ceiling;
   a linear rail coupled to the mounting plate; and
   a rotational stage configured to ride along the rail, wherein the sensor is mounted to the rotational stage and the rotational stage is configured to rotate the sensor relative to the ceiling.

4. The semiconductor processing chamber of claim 3, wherein the substrate support is configured to rotate and the movement assembly is configured to move the sensor, and wherein the sensor has a spiral read path for the temperature locations along the substrate support.

5. The semiconductor processing chamber of claim 4, wherein the stage is configured to rotate.

6. The semiconductor processing chamber of claim 3, wherein the sensor is a pyrometer.

7. The semiconductor processing chamber of claim 2, wherein the movement assembly further comprises:
   a mounting plate, the mounting plate coupling the movement assembly to the ceiling;
   a rotational stage attached to mounting plate; and
   a gimbal mount attached to the rotational stage, the sensor mounted to the gimbal mount, wherein the rotational stage and gimbal mount provide the sensor with two degrees of rotation.

8. The semiconductor processing chamber of claim 7, wherein the sensor can be rotated to detect a first temperature of the lower portion of the body and a second temperature of the a substrate support.

9. The semiconductor processing chamber of claim 8, wherein the sensor is a pyrometer.

10. A sensor assembly for an epitaxy processing chamber, the sensor assembly comprising:
    a movement assembly coupled to a mounting plate disposed outside the epitaxy processing chamber; and
    a sensor coupled to the movement assembly, the sensor configured to detect a temperature location in an interior volume of the epitaxy processing chamber, wherein the sensor is rotatable relative to the epitaxy processing chamber in generating a temperature map of the interior volume of the epitaxy processing chamber.

11. The sensor assembly of claim 10, wherein the movement assembly further comprises:
    a rotational stage attached to the mounting plate; and
    a gimbal mount attached to the rotational stage, the sensor mounted to the gimbal mount, wherein the rotational stage and gimbal mount provide the sensor with two degrees of rotation.

12. The sensor assembly of claim 11, wherein the sensor is a pyrometer.

13. The sensor assembly of claim 11, wherein the movement assembly further comprises:
    a linear rail coupling the mounting plate to the rotational stage, wherein
    the rotational stage is configured to ride along the rail.

14. A method for mapping a temperature of a substrate in a processing chamber, the method comprising:
    placing a substrate on a substrate support assembly within a processing chamber, wherein the processing chamber has a ceiling disposed above the substrate support;
    detecting the temperature of the substrate with a sensor disposed above the ceiling of the processing chamber;
    moving the sensor in a rotating manner about an axis relative to the ceiling to sense the substrate with a plurality of temperature readings; and
    generating a temperature map of the substrate with the plurality of temperature readings.

15. The method of claim 14 wherein moving the sensor relative to the ceiling further comprises:
    moving the sensor along a linear rail coupled to a rotational stage and the ceiling.

16. The method of claim 14 wherein moving the sensor relative to the ceiling further comprises:
    rotating a rotational stage supporting the sensor wherein the stage is rotational coupled to the ceiling.

17. The method of claim 14 wherein moving the sensor relative to the ceiling further comprises:
    linearly moving a stage along a linear rail coupled to the ceiling;
    rotating a rotational stage supporting the sensor wherein the stage is coupled to the linear rail; and
    pivoting the sensor relative to the stage supporting the sensor.

18. The method of claim 14 further comprising:
    comparing a calculated and measured temperature locations in the temperature map to a map of acceptable temperature; and
    sending a message in determination that the temperature map has sample or calculated locations outside of acceptable ranges.

19. The method of claim 14 further comprising:
    utilizing the temperature map in a machine learning algorithm to identify fault scenarios; and
    scheduling a relevant event based on the identified fault.

* * * * *